(12) United States Patent
Liu et al.

(10) Patent No.: US 11,862,646 B2
(45) Date of Patent: Jan. 2, 2024

(54) DISPLAY SUBSTRATE, MANUFACTURING METHOD THEREOF, TOUCH DISPLAY PANEL AND DISPLAY PANEL

(71) Applicant: BOE TECHNOLOGY GROUP CO., LTD., Beijing (CN)

(72) Inventors: Libin Liu, Beijing (CN); Can Zheng, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/760,988

(22) PCT Filed: May 18, 2021

(86) PCT No.: PCT/CN2021/094307
§ 371 (c)(1),
(2) Date: Mar. 16, 2022

(87) PCT Pub. No.: WO2021/233277
PCT Pub. Date: Nov. 25, 2021

(65) Prior Publication Data
US 2022/0336500 A1  Oct. 20, 2022

(30) Foreign Application Priority Data

May 20, 2020  (CN) .......................... 202010432298.9

(51) Int. Cl.
*H01L 27/12* (2006.01)
*G06F 3/041* (2006.01)
(Continued)

(52) U.S. Cl.
CPC .......... *H01L 27/124* (2013.01); *G06F 3/0412* (2013.01); *G06F 3/0443* (2019.05);
(Continued)

(58) Field of Classification Search
None
See application file for complete search history.

(56) References Cited

U.S. PATENT DOCUMENTS

2013/0113688 A1* 5/2013 Choi ..................... G09G 3/3266
345/76
2013/0256676 A1* 10/2013 Jin ..................... H10K 59/1213
438/34
(Continued)

FOREIGN PATENT DOCUMENTS

CN  101369082 B  *  6/2010
CN  203376434 U  *  1/2014
(Continued)

*Primary Examiner* — Duane N Taylor, Jr.
(74) *Attorney, Agent, or Firm* — HOUTTEMAN LAW LLC

(57) ABSTRACT

Embodiments of the present disclosure provide a display substrate, a touch display panel and a display panel. The display substrate has a display region and a pin region on a side of the display region. The display substrate includes: a base substrate; and at least one first signal line and at least one second signal line both on a side of the base substrate and both extending to the display region from the pin region. The display substrate further includes a DC conductive structure connected to a constant DC voltage. The DC conductive structure is between the at least one first signal line and the at least one second signal line. Each of the at least one first signal line and the at least one second signal line is spaced apart from the DC conductive structure.

18 Claims, 2 Drawing Sheets

(51) Int. Cl.
*G06F 3/044* (2006.01)
*G06F 3/01* (2006.01)

(52) U.S. Cl.
CPC ............... *H01L 27/1259* (2013.01); *G06F 2203/04103* (2013.01); *G06F 2203/04107* (2013.01)

(56) References Cited

U.S. PATENT DOCUMENTS

| | | | |
|---|---|---|---|
| 2016/0204172 A1* | 7/2016 | Park | H10K 59/124 257/40 |
| 2019/0181155 A1 | 6/2019 | Li et al. | |
| 2020/0103688 A1 | 4/2020 | Lee et al. | |
| 2022/0077268 A1 | 3/2022 | Liu et al. | |

FOREIGN PATENT DOCUMENTS

| | | |
|---|---|---|
| CN | 106847161 A | 6/2017 |
| CN | 107958922 A | 4/2018 |
| CN | 110890387 A | 3/2020 |
| CN | 111610884 A | 9/2020 |

* cited by examiner

DISPLAY SUBSTRATE, MANUFACTURING METHOD THEREOF, TOUCH DISPLAY PANEL AND DISPLAY PANEL

CROSS REFERENCE TO RELATED APPLICATIONS

The present application claims the priority to Chinese Patent Application No. 202010432298.9, filed on May 20, 2020, the contents of which are incorporated herein by reference in its entirety.

FIELD OF THE DISCLOSURE

The present disclosure relates to the field of display technology, and in particular, to a display substrate, a manufacturing method thereof, a touch display panel, and a display panel.

BACKGROUND OF THE DISCLOSURE

Direct current (DC) power supply lines and various signal lines need to be arranged in a display panel. The DC power supply lines supply an operation voltage to internal devices of the display panel, and the various signal lines supply control signals to the internal devices of the display panel. The DC power supply lines and the various signal lines are gathered in a pin region (i.e., the fanout region) of the display panel.

SUMMARY OF THE DISCLOSURE

As an aspect, the present disclosure provides a display substrate having a display region and a pin region on a side of the display region. The display substrate includes a base substrate; and at least one first signal line and at least one second signal line both on a side of the base substrate and both extending to the display region from the pin region. The display substrate further includes a direct current (DC) conductive structure connected to a constant DC voltage. The DC conductive structure is between the at least one first signal line and the at least one second signal line and spaced apart from each of the at least one first signal line and the at least one second signal line.

In an embodiment, in the display region and/or in the pin region, the DC conductive structure is between the at least one first signal line and the at least one second signal line and spaced apart from each of the at least one first signal line and the at least one second signal line by an insulation layer.

In an embodiment, the at least one first signal line, the DC conductive structure, and the at least one second signal line are respectively in three different layers stacked along a direction perpendicular to the base substrate. An orthographic projection of the at least one first signal line on the base substrate, an orthographic projection of the DC conductive structure on the base substrate, and an orthographic projection of the at least one second signal line on the base substrate overlap each other.

In an embodiment, all of the at least one first signal line, the at least one second signal line, and the DC conductive structure are in a same layer.

In an embodiment, the DC conductive structure includes a first DC conductive structure and a second DC conductive structure electrically connected to each other through a via hole. The first DC conductive structure is in the same layer as the at least one first signal line and the at least one second signal line, and between the at least one first signal line and the at least one second signal line. The second DC conductive structure is on a side of the first DC conductive structure away from the base substrate. An orthographic projection of the second DC conductive structure on the base substrate covers orthographic projections of the first DC conductive structure, the at least one first signal line and the at least one second signal line on the base substrate.

In an embodiment, an extension direction of the DC conductive structure, an extension direction of the at least one first signal line, and an extension direction of the at least one second signal line are parallel to each other.

In an embodiment, the at least one first signal line and the at least one second signal line are two different types of signal lines.

In an embodiment, the at least one first signal line comprises at least one signal line of the same type parallel to each other; and/or the at least one second signal line comprises at least one signal line of the same type parallel to each other.

In an embodiment, one terminal of the DC conductive structure is grounded.

In an embodiment, the DC conductive structure has a stacked metal structure of Ti/Al/Ti.

As another aspect, the present disclosure provides a touch display panel, including above display substrate. The display substrate includes a gate layer, a source-drain electrode layer and a touch sense layer stacked on the base substrate. The at least one first signal line is in the gate layer, the at least one second signal line is in the touch sense layer, the DC conductive structure is in the source-drain electrode layer, and the DC conductive structure is connected to a VDD voltage of the touch display panel.

In an embodiment, the at least one first signal line is a display data signal line, and the at least one second signal line is a touch data signal line.

In an embodiment, the display data signal line is made of molybdenum, and the touch data signal line is made of Ti/Al/Ti.

As another aspect, the present disclosure provides a display panel including above display substrate. The display substrate includes a buffer layer, an interlayer insulation layer, a source-drain electrode layer and a planarization layer stacked on the base substrate. All of the at least one first signal line, the at least one second signal line and the DC conductive structure are in the source-drain electrode layer. The DC conductive structure is connected to a VDD voltage of the display panel.

In an embodiment, the at least one first signal line and the at least one second signal line are any two different types of signal lines of a gate signal line, an initialization signal line, a data line, and a reset signal line.

As yet another aspect, the present disclosure provides a method for manufacturing a display substrate having a display region and a pin region on a side of the display region. The method includes: forming at least one first signal line and at least one second signal line extending from the pin region to the display region on a side of a base substrate; and forming a DC conductive structure between the at least one first signal line and the at least one second signal line, such that each of the at least one first signal line and the at least one second signal line is spaced apart from the DC conductive structure, the DC conductive structure being connected to a constant DC voltage.

In an embodiment, forming the DC conductive structure between the at least one first signal line and the at least one second signal line, includes: respectively forming the at least one first signal line, the DC conductive structure, and the at least one second signal line in three different layers stacked along a direction perpendicular to the base substrate, such that an orthographic projection of the at least one first signal line on the base substrate, an orthographic projection of the DC conductive structure on the base substrate, and an orthographic projection of the at least one second signal line on the base substrate overlap each other.

In an embodiment, forming the DC conductive structure between the at least one first signal line and the at least one second signal line, includes: forming the at least one first signal line, the at least one second signal line, and the DC conductive structure in a same layer.

In an embodiment, the DC conductive structure includes a first DC conductive structure and a second DC conductive structure electrically connected by a via hole. Forming the DC conductive structure between the at least one first signal line and the at least one second signal line, includes: forming the first DC conductive structure, the at least one first signal line, and the at least one second signal line in a same layer, such that the first DC conductive structure is between the at least one first signal line and the at least one second signal line, and forming the second DC conductive structure on a side of the first DC conductive structure away from the base substrate, such that an orthographic projection of the second DC conductive structure on the base substrate covers orthographic projections, on the base substrate, of the first DC conductive structure, the at least one first signal line and the at least one second signal line.

DETAILED DESCRIPTION OF THE EXEMPLARY EMBODIMENTS

In order to make those skilled in the art better understand the technical solutions of the present disclosure, the present disclosure is further described in detail below with reference to the accompanying drawings and specific embodiments.

The inventors of the present disclosure have found that, generally, the pin region of the display panel is smaller than the display region of the display panel. The wiring in the pin region is relatively limited, and the phenomena, such as too small distance between signal lines, or cross wiring of the signal lines, etc. exist. In this case, parasitic capacitance is generated, and the accuracy of the control signals in the signal lines is affected due to noise, and thus the performance of the display panel is affected too.

The present disclosure provides a base substrate, a touch display panel and a display panel, which are intended to solve at least a part of the above technical problems of the related art.

The technical solution of the present disclosure will be illustrated in combination with embodiments in detail below.

Figure 1:
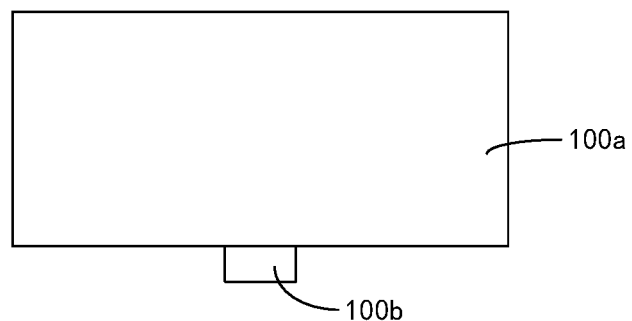
FIG. 1 is a schematic diagram showing a structure of a display substrate according to an embodiment of the present disclosure.

FIG. 1 is a schematic diagram showing a structure of a display substrate according to an embodiment of the present disclosure. As shown in FIG. 1, the display substrate 100 has a display region 100a and a pin region 100b.

Figure 2:
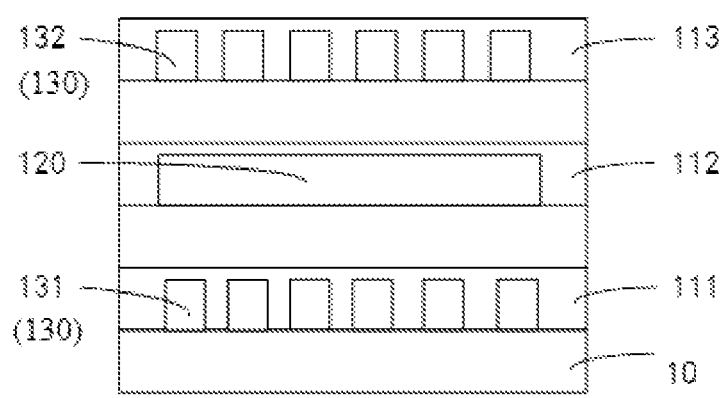
FIG. 2 is a schematic diagram showing a layout of a DC conductive structure and signal lines in a display substrate according to an embodiment of the present disclosure.

As shown in FIG. 2, the display substrate 100 includes a base substrate 10, at least two types of signal lines 130, and a DC conductive structure 120. The at least two types of signal lines 130 extend from the pin region 100b to the display region 100a.

In an embodiment, in the pin region 100b, the DC conductive structure 120 is disposed between any two types of signal lines 130, and each of the any two types of signal lines 130 is spaced apart from the DC conductive structure 120.

In the embodiment, in the pin region 100b of the display substrate 100, the DC conductive structure 120 is disposed between the first signal lines 131 and the second signal lines 132. After a constant DC voltage (e.g., VDD DC voltage), which is equivalent to a reference potential, is supplied to the DC conductive structure 120, a stable electric field can be formed, and the DC potential is too strong to be easily disturbed. Therefore, the pulse signals in the first signal lines 131 and the second signal lines 132 separated by the DC conductive structure 120 have a stable reference potential of the DC potential, so as to effectively reduce the parasitic influence between the first signal lines 131 and the second signal lines 132, that is, to prevent the possible mutual interference between the first signal lines 131 and the second signal lines 132. Therefore, the precision of signal transmitted in the pin region 100b with a limited space can be optimized, and the performance of the device can be improved.

In an embodiment, the at least two types of signal lines 130 may include at least one first signal line 131, at least one second signal line 132 . . . , and at least one Nth signal line, i.e., the signal lines 130 for transmitting different pulse signals. The pulse signals may include a display data signal and a touch data signal. It is understood that the signal line 130 for transmitting the display data signal is the display data signal line 130, and the signal line 130 for transmitting the touch data signal is the touch data signal line 130.

The inventors of the present disclosure have found that non-negligible signal interference exists in the display region 100a of the display substrate 100. To this end, the present disclosure provides an implementation for the display substrate 100 as follows.

Figure 3:
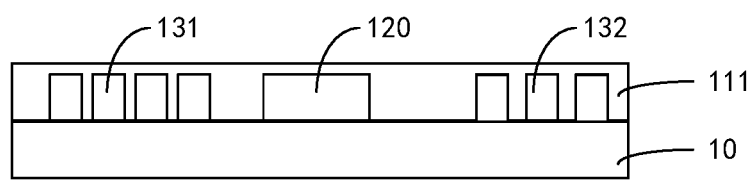
FIG. 3 is a schematic diagram showing a layout of a DC conductive structure and signal lines in a display substrate according to an embodiment of the present disclosure.
Figure 4:
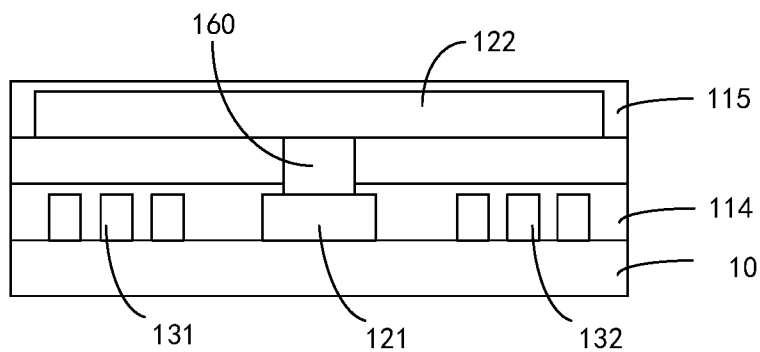
FIG. 4 is a schematic diagram showing a layout of a DC conductive structure and signal lines in a display substrate according to an embodiment of the present disclosure.

As shown in FIGS. 2 to 4, in the display region 100a, the DC conductive structure 120 is disposed between two types (i.e., any two types) of signal lines 130 of the at least two types of signal lines 130, and any one of the two types (i.e., any two types) of signal lines 130 is spaced apart from the DC conductive structure 120.

In the present embodiment, in the display region 100a of the display substrate 100, the DC conductive structure 120 is disposed between the first signal lines 131 and the second signal lines 132. After a DC voltage (e.g., VDD DC voltage), which is equivalent to a reference potential, is supplied into the DC conductive structure 120, a stable electric field can be formed, and the DC potential is too strong to be easily disturbed. Therefore, the pulse signals in the first signal lines 131 and the second signal lines 132 separated by the DC conductive structure 120 have a stable reference potential of the DC potential, so as to effectively reduce the parasitic influence between the first signal lines 131 and the second signal lines 132, that is, to prevent the possible mutual interference between the first signal lines 131 and the second signal lines 132. Therefore, the precision of signal transmitted in the display region 100a of the display substrate 100, and the performance of the device can be improved. The present disclosure is particularly suitable for devices having a high wiring density in the display region 100a, such as a small display panel and an ultra-clear display panel.

In an embodiment, the display region 100a of the display substrate 100 corresponds to a display region of a display panel. Alternatively, the display region 100a of the display substrate 100 corresponds to a touch display region of a touch display panel.

The inventors of the present disclosure consider that when the signal lines 130 are wired arbitrarily, phenomena such as cross wiring occur and the probability of mutual interference increases.

As such, in an embodiment, as shown in FIGS. 2 to 4, according to the display substrate 100 in the embodiment of the present disclosure, the at least two types of signal lines 130 are disposed in parallel.

The first signal lines 131 and the second signal lines 132 may be of the same type, such as data lines. That is, the DC conductive structure is disposed between two data lines.

In an embodiment, the first signal lines 131 and the second signal lines 132 may be of two different types, such as data lines and gate lines. That is, the DC conductive structure is disposed between one data line and one gate line.

In the embodiment, in the pin region 100b and/or the display region 100a of the display substrate 100, the signal lines 130 are disposed in parallel, so that the phenomenon such as crossing wiring can be reduced, the possible mutual interference between the two types of signal lines 130 can be reduced, and the utilization rate of the wiring space can be improved too.

In an embodiment, as shown in FIG. 2, the first signal lines 131 of the at least two types of signal lines 130 are located in a first layer 111 of the display substrate 100, the second signal lines 132 of the at least two types of signal lines 130 are located in a third layer 113 of the display substrate 100, and the DC conductive structure 120 is located in a second layer 112 of the display substrate 100. The first layer 111, the second layer 112, and the third layer 113 are three different layers.

The second layer 112 is located between the first layer 111 and the third layer 113.

In the embodiment, the first signal lines 131, the second signal lines 132 and the DC conductive structure 120 are respectively located in three different layers stacked along a direction perpendicular to the base substrate 10, and the DC conductive structure 120 spaces the first signal lines 131 apart from the second signal lines 132 along a thickness direction of the display substrate 100 to shield the first signal lines 131 and the second signal lines 132. This arrangement is suitable for a device with many layers.

In an embodiment, the at least one first signal line 131 may include at least one signal line of the same type, and the at least one second signal line 132 may include at least one signal line of the same type. As shown in FIGS. 2, 3, and 4, FIG. 2 shows that the first signal lines 131 and the second signal lines 132 each include six signal lines of the same type, FIG. 3 shows that the first signal lines 131 include three signal lines of the same type, and the second signal lines 132 include four signal lines of the same type. In the embodiment, as shown in FIG. 2, the at least one first signal line includes a plurality of first signal lines, the at least one second signal line includes a plurality of second signal lines, and the DC conductive structure 120 may be a planar conductive structure, so that an orthogonal projection of the DC conductive structure 120 on the base substrate 10, an orthogonal projection of the at least one first signal line 131 on the base substrate 10, and an orthogonal projection of the at least one second signal line line 132 on the base substrate 10 may overlap each other.

A width of the DC conductive structure 120 may be substantially equal to a distance from a first one to a last one of the plurality of first signal lines sequentially arranged. The width of the DC conductive structure 120 may be substantially equal to a distance from a first one to a last one of the plurality of second signal lines sequentially arranged.

However, the number of signal lines is not limited thereto, and the at least one first signal line 131 or the at least one second signal line 132 may include only one signal line.

As shown in FIG. 2, in the display region 100a and/or the pin region 100b, an extension direction of the first signal lines 131, an extension direction of the second signal lines 132, and an extension direction of the DC conductive structure 120 are parallel to each other. The DC conductive structure 120 is disposed between the first signal lines 131 and second signal lines 132. The orthographic projections of the first signal lines 131 on the base substrate 10, the orthographic projection of the DC conductive structure 120 on the base substrate 10, and the orthographic projections of the second signal lines 132 on the base substrate 10 overlap each other.

In an embodiment, in the display region 100a and/or the pin region 100b, the DC conductive structure 120 is disposed between the first signal lines 131 and second signal lines 132 in an intersection region where the first signal lines 131 and second signal lines 132 cross over each other. In the intersection region, the orthogonal projections of the first signal lines 131 on the base substrate 10, the orthogonal projection of the DC conductive structure 120 on the base substrate 10, and the orthogonal projections of the second signal lines 132 on the base substrate 10 overlap each other.

In an embodiment, as shown in FIG. 3, all of the first signal lines 131 and second signal lines 132 and the DC conductive structure 120 are located in the same layer, i.e., are covered by the same insulation layer.

In the embodiment, the first signal lines 131, the second signal lines 132 and the DC conductive structure 120 are located in the same layer. The DC conductive structure 120 spaces the first signal lines 131 apart from the second signal lines 132 along a direction parallel of the display substrate 100 so as to shield the first signal lines 131 from the second signal lines 132. This arrangement is beneficial to thinning of the device.

As shown in FIG. 3, in the display region 100a and/or the pin region 100b, the extension direction of the first signal lines 131, the extension direction of the second signal lines 132, and the extension direction of the DC conductive structure 120 are parallel to each other.

It is understood that an insulation process is performed on the first signal lines 131, the second signal lines 132 and the DC conductive structure 120. For example, an insulation structure (i.e., an insulation layer) for insulating the signal lines 130 from the DC conductive structure 120 is formed.

In an embodiment, as shown in FIG. 4, the DC conductive structure 120 includes a first DC conductive structure 121 and a second DC conductive structure 122.

The first DC conductive structure is disposed between any two types of signal lines. The first signal lines 131, second signal lines 132, and the first DC conductive structure 121 are all located in a fourth layer 114 of the display substrate 100, and the second DC conductive structure 122 is located in a fifth layer 115 of the display substrate 100.

The second DC conductive structure 122 is located on a side of the first DC conductive structure 121, the first signal lines 131, and the second signal lines 131 and 132 away from the base substrate 10. The first DC conductive structure 121 and the second DC conductive structure 122 are electrically connected to each other through a via hole 160.

An orthogonal projection of the second DC conductive structure 122 on the fourth layer 114 or the base substrate 10 at least covers an orthogonal projection of the first DC conductive structure 121 on the base substrate 10 and covers the orthogonal projections, on the base substrate 10, of the first signal lines 131 and second signal lines 132 adjacent to the first DC conductive structure 121.

In the embodiment, the first DC conductive structure 121, the first signal lines 131, and the second signal lines 132 are located in the fourth layer 114 of the display substrate 100. The first DC conductive structure 121 separates the first signal lines 131 from the second signal lines 132 to shield the first signal lines 131 and the second signal lines 132. The second DC conductive structure 122 is located in the fifth layer 115 of the display substrate 100, and the first DC conductive structure 121 and the second DC conductive structure 122 are electrically connected to each other through the via hole 160, that is, the first DC conductive structure 121 has the same potential as the second DC conductive structure 122. The second DC conductive structure 122 extends along a direction parallel to the display substrate 100, so as to wrap, together with the first DC conductive structure 121, the first signal lines 131 and the second signal lines 132, thereby enhancing the shielding effect for the first signal lines 131 and the second signal lines 132.

In an embodiment, an orthogonal projection of the second DC conductive structure 122 on the base substrate 10 covers an orthogonal projection of the first DC conductive structure 121 on the base substrate 10 and covers the orthogonal projections of the first signal lines 13 and second signal lines 132 on the base substrate 10.

The extension direction of the first signal lines 131, the extension direction of the second signal lines 132, and the extension direction of the first DC conductive structure 121 are parallel to each other.

In an embodiment, one terminal of the DC conductive structure 120 is grounded.

In the embodiment, the DC conductive structure 120 is grounded, so as to guide an external interference signal to the ground, thereby preventing the interference signal from entering the signal lines 130, preventing the interference signal from interfering the control signals in the signal lines 130, and thus avoiding the loss of the control signals.

In an embodiment, the DC conductive structure 120 has a metal structure made of Ti/Al/Ti. That is, the DC conductive structure 120 has a metal structure in which Ti (titanium)/Al (aluminum)/Ti are stacked.

Based on the same inventive concept, an embodiment of the present disclosure provides a touch display panel, including: any one of the display substrates 100 in the above embodiments.

The display substrate 100 includes a gate layer, a source-drain electrode layer, and a touch sense layer stacked on the base substrate 10.

The first signal lines 131 of the at least two types of signal lines 130 of the display substrate 100 are located in the gate layer 111.

The second signal lines 132 of the at least two types of signal lines 130 of the display substrate 100 are located in the touch sense layer 113.

The DC conductive structure 120 of the display substrate 100 is located in the source-drain electrode layer 112.

In the embodiment, the display device includes the display panel provided in the foregoing embodiments, and reference may be made to the foregoing embodiments for the principle and technical effect, which will not described herein again.

In an embodiment, the first signal lines 131 of the at least two types of signal lines 130 of the display substrate 100 are display data signal lines, and the second signal lines 132 of the at least two types of signal lines 130 of the display substrate 100 are touch data signal lines.

The DC conductive structure 120 of the display substrate 100 is a power supply structure for supplying power to the touch display panel, and the DC conductive structure 120 is connected to a constant DC voltage VDD of the touch display panel.

Specifically, the display data signal lines 131 may be made of molybdenum, and the touch data signal lines 132 may be made of Ti/Al/Ti.

Based on the same inventive concept, an embodiment of the present disclosure provides a display panel including: the display substrate 100 provided in any one of the above embodiments.

The display substrate 100 includes a buffer layer, an interlayer insulation layer, a source-drain electrode layer, and a planarization layer stacked on the base substrate 10.

The at least two types of signal lines 131 and 132 and the DC conductive structure 120 of the display substrate 100 are located in the source-drain electrode layer 111.

In the embodiment, the display device includes the display panel provided in the foregoing embodiments, and reference can be made to the foregoing embodiments for the principle and technical effect, which will not be described herein again.

In an embodiment, the at least two types of signal lines 130 of the display substrate 100 include at least two of the gate lines 130, the initialization signal lines 130 (which are input signal lines (sty) of the GOA driving circuit), the data signal lines 130, and reset signal lines 130.

The DC conductive structure 120 is a power supply structure of the display panel, and the DC conductive structure 120 is connected to a constant DC voltage VDD of the display panel.

According to an embodiment of the present invention, a method for manufacturing a display substrate is provided. The display substrate has a display region 100a and a pin region 100b on a side of the display region. The method includes: forming a first signal line 131 and a second signal line 132 extending from the pin region 100b to the display region 100a on a side of the base substrate 10; forming a DC conductive structure 120 between the first signal line 131 and second signal line 132, such that each of the first and second signal lines 131 and 132 is spaced apart from the DC conductive structure 120, the DC conductive structure 120 being connected to a constant DC voltage.

The first signal line 131, the second signal line 132, and the DC conductive structure 120 are respectively formed in three different layers stacked along a direction perpendicular to the base substrate 10, such that an orthogonal projection of the first signal line 131 on the base substrate 10, an orthogonal projection of the second signal line 132 on the base substrate 10, and an orthogonal projection of the DC conductive structure 120 on the base substrate 10 overlap each other.

Alternatively, the first signal line 131, the second signal line 132, and the DC conductive structure 120 are formed in the same layer.

The DC conductive structure 120 includes a first DC conductive structure 121 and a second DC conductive structure 122 electrically connected by a via hole 160.

The first DC conductive structure 121, the first signal line 131, and the second signal line 132 are formed in the same layer 114, such that the first DC conductive structure 120 is located between the first signal line 131 and the second signal line 132.

The second DC conductive structure 122 is formed on a side of the first DC conductive structure 121 away from the base substrate 10, such that an orthographic projection of the second DC conductive structure 122 on the base substrate 10 covers an orthographic projection of the first DC conductive structure 121 on the base substrate 10, and covers orthographic projections of the first and second signal lines 131 and 132 on the base substrate 10.

The first signal line and the second signal line are two different types of signal lines.

The first signal line includes at least one signal line of the same type parallel to each other. The second signal line includes at least one signal line of the same type parallel to each other.

According to the embodiments of the present disclosure, the following beneficial effects can be at least realized.

1. The DC conductive structure 120 is disposed between any two types of signal lines 130. After a DC voltage is supplied into the DC conductive structure 120, the parasitic influence between the two types of signal lines 130 can be effectively reduced, and possible mutual interference between the two types of signal lines 130 can be prevented.

2. The signal lines 130 are arranged in parallel, thereby not only reducing the phenomenon such as crossed wiring, but also the mutual interference between the two types of signal lines 130, and improving the utilization rate of wiring space.

3. The at least two signal lines 130 and the DC conductive structure 120 are respectively located in different layers, and the DC conductive structure 120 spaces the two signal lines 130 apart from each other along a thickness direction of the display substrate 100 to shield the two signal lines 130. This arrangement is suitable for devices with a plurality of layers.

4. The at least two signal lines 130 and the DC conductive structure 120 are located on the same layer, and the DC conductive structure 120 spaces the two signal lines 130 apart from each other along a plane direction of the display substrate 100 to shield the two signal lines 130. This arrangement is beneficial to thinning of the device.

5. The DC conductive structure 120 is grounded to guide an external interference signal to the ground, thereby preventing the interference signal from entering the signal lines 130 and from interfering the control signal in the signal line 130, and thus avoiding the loss of the control signals.

It will be understood that the above embodiments are merely exemplary embodiments employed to illustrate the principles of the present disclosure, and the present disclosure is not limited thereto. It will be apparent to those skilled in the art that various changes and modifications can be made without departing from the spirit and scope of the present disclosure, and these changes and modifications are to be considered within the scope of the present disclosure.

What is claimed is:

1. A display substrate having a display region and a pin region on a side of the display region, comprising:
a base substrate; and
at least one first signal line and at least one second signal line both on a side of the base substrate and both extending to the display region from the pin region;
wherein the display substrate further comprises a direct current (DC) conductive structure connected to a constant DC voltage, and
the DC conductive structure is between the at least one first signal line and the at least one second signal line and spaced apart from each of the at least one first signal line and the at least one second signal line,
the DC conductive structure has a stacked metal structure of titanium/aluminum/titanium (Ti/Al/Ti).

2. The display substrate of claim 1, wherein
in the display region and/or in the pin region, the DC conductive structure is between the at least one first signal line and the at least one second signal line and spaced apart from each of the at least one first signal line and the at least one second signal line by an insulation layer.

3. The display substrate of claim 1, wherein
the at least one first signal line, the DC conductive structure, and the at least one second signal line are respectively in three different layers stacked along a direction perpendicular to the base substrate, and
an orthographic projection of the at least one first signal line on the base substrate, an orthographic projection of the DC conductive structure on the base substrate, and an orthographic projection of the at least one second signal line on the base substrate overlap each other.

4. The display substrate of claim 1, wherein
all of the at least one first signal line, the at least one second signal line, and the DC conductive structure are in a same layer.

5. The display substrate of claim 4, wherein
the DC conductive structure comprises a first DC conductive structure and a second DC conductive structure electrically connected to each other through a via hole,
the first DC conductive structure is in the same layer as the at least one first signal line and the at least one second signal line, and between the at least one first signal line and the at least one second signal line,
the second DC conductive structure is on a side of the first DC conductive structure away from the base substrate, and
an orthographic projection of the second DC conductive structure on the base substrate covers orthographic projections of the first DC conductive structure, the at least one first signal line and the at least one second signal line on the base substrate.

6. The display substrate of claim 2, wherein
an extension direction of the DC conductive structure, an extension direction of the at least one first signal line, and an extension direction of the at least one second signal line are parallel to each other.

7. The display substrate of claim 1, wherein
the at least one first signal line and the at least one second signal line are two different types of signal lines.

8. The display substrate of claim 7, wherein
the at least one first signal line comprises at least one signal line of the same type parallel to each other; and/or
the at least one second signal line comprises at least one signal line of the same type parallel to each other.

9. The display substrate of claim 1, wherein
one terminal of the DC conductive structure is grounded.

10. A touch display panel, comprising: the display substrate of claim 1, wherein the display substrate comprises a gate layer, a source-drain electrode layer and a touch sense layer stacked on the base substrate;

the at least one first signal line is in the gate layer;

the at least one second signal line is in the touch sense layer;

the DC conductive structure is in the source-drain electrode layer, and the DC conductive structure is connected to a constant direct current voltage of the touch display panel.

11. The touch display panel of claim 10, wherein the at least one first signal line is a display data signal line, and the at least one second signal line is a touch data signal line.

12. The touch display panel of claim 11, wherein the display data signal line contains molybdenum, and the touch data signal line contains Ti/Al/Ti.

13. A display panel, comprising: the display substrate of claim 1, wherein the display substrate comprises a buffer layer, an interlayer insulation layer, a source-drain electrode layer and a planarization layer stacked on the base substrate, all of the at least one first signal line, the at least one second signal line and the DC conductive structure are in the source-drain electrode layer, and the DC conductive structure is connected to a constant direct current voltage of the display panel.

14. The display panel of claim 13, wherein the at least one first signal line and the at least one second signal line are any two different types of signal lines of a gate signal line, an initialization signal line, a data line, and a reset signal line.

15. A method for manufacturing a display substrate having a display region and a pin region on a side of the display region, the method comprising:

forming at least one first signal line and at least one second signal line extending from the pin region to the display region on a side of a base substrate; and forming a direct current (DC) conductive structure having a stacked metal structure of titanium/aluminum/titanium (Ti/Al/Ti) between the at least one first signal line and the at least one second signal line, such that each of the at least one first signal line and the at least one second signal line is spaced apart from the DC conductive structure, the DC conductive structure being connected to a constant DC voltage.

16. The method of claim 15, wherein forming the DC conductive structure between the at least one first signal line and the at least one second signal line, comprises:

respectively forming the at least one first signal line, the DC conductive structure, and the at least one second signal line in three different layers stacked along a direction perpendicular to the base substrate, such that an orthographic projection of the at least one first signal line on the base substrate, an orthographic projection of the DC conductive structure on the base substrate, and an orthographic projection of the at least one second signal line on the base substrate overlap each other.

17. The method of claim 15, wherein forming the DC conductive structure between the at least one first signal line and the at least one second signal line, comprises:

forming the at least one first signal line, the at least one second signal line, and the DC conductive structure in a same layer.

18. The method of claim 17, wherein the DC conductive structure comprises a first DC conductive structure and a second DC conductive structure electrically connected by a via hole, and forming the DC conductive structure between the at least one first signal line and the at least one second signal line, comprises:

forming the first DC conductive structure, the at least one first signal line, and the at least one second signal line in a same layer, such that the first DC conductive structure is between the at least one first signal line and the at least one second signal line, and forming the second DC conductive structure on a side of the first DC conductive structure away from the base substrate, such that an orthographic projection of the second DC conductive structure on the base substrate covers orthographic projections, on the base substrate, of the first DC conductive structure, the at least one first signal line and the at least one second signal line.

* * * * *